United States Patent [19]

Schnable et al.

[11] 3,922,420

[45] Nov. 25, 1975

[54] METHOD OF MAKING A SEMI-TRANSPARENT PHOTOMASK

[75] Inventors: George Luther Schnable, Landsdale, Pa.; Nathan Feldstein, Kendall Park, N.J.

[73] Assignee: RCA Corporation, New York, N.Y.

[22] Filed: May 31, 1974

[21] Appl. No.: 475,094

[52] U.S. Cl. ................ 428/210; 148/6.3; 148/6.35; 204/38 B; 427/108; 428/432

[51] Int. Cl.[2] ........................ B32B 3/10; B32B 17/00

[58] Field of Search .......... 117/211, 215, 212, 33.3, 117/45, 69, 124 A, 239

[56] References Cited

UNITED STATES PATENTS

| | | | |
|---|---|---|---|
| 2,675,740 | 4/1954 | Barkley | 117/33.3 |
| 3,110,613 | 11/1963 | Bean | 117/124 A |
| 3,202,054 | 8/1965 | Mochel | 117/33.3 |
| 3,309,218 | 3/1967 | Brader, Jr. et al. | 117/33.3 |
| 3,695,908 | 10/1972 | Szupillo | 117/124 A |
| 3,826,728 | 7/1974 | Chambers et al. | 117/124 C |

*Primary Examiner*—Cameron K. Weiffenbach
*Attorney, Agent, or Firm*—Glenn H. Bruestle; William S. Hill

[57] ABSTRACT

A method of making a semi-transparent photomask of the iron oxide type comprising depositing a thin film of nickel or of a nickel alloy on a glass substrate, forming on the nickel or nickel alloy film a pattern of a resist which is the negative of the desired photomask, electrolytically depositing a layer of iron on the areas of the alloy film not covered by the resist, removing the resist and heating the assembly in an oxidizing atmosphere to convert the iron layer to iron oxide and also to convert the nickel or nickel alloy film to transparent oxides, at the same time providing improved adherence.

2 Claims, 8 Drawing Figures

METHOD OF MAKING A SEMI-TRANSPARENT PHOTOMASK

BACKGROUND OF THE INVENTION

In the electronics industry and in other industries, photomasks are widely used for defining images in films of photoresist material. In the past, photomasks have usually comprised two principal types. One of these is a silver image derived from a silver halide photographic gelatin emulsion on a glass or other transparent substrate and the other is a patterned chromium film on a glass substrate.

In both types of masks, the opaque areas do not transmit either visible light or ultraviolet light. Photoresists are usually exposed with an ultraviolet light source. In the electronics industry, the manufacture of integrated circuits requires the successive use of a plurality of photomasks in making one circuit pattern. These masks must be very accurately positioned to achieve proper registry of patterns. Since the opaque areas of the masks do not transmit visible light, exact positioning of the masks can be a serious problem.

Sodium light is usually used in aligning photomasks. Due to the opaqueness of the types of masks described above, at the wavelength of the sodium D line (589 nm), which makes registration with existing patterns difficult, attempts have been made to develop a semi-transparent type mask. A preferred type of semitransparent mask should have the following characteristics:

1. The film should have virtually zero transmission in the wavelength region below 450 nm. This region (the blue and ultraviolet) corresponds to the spectral range in which most commercial photoresists are sensitive.

2. For purposes of alignment, the film should be at least 30 percent transmitting in the 589 nm region. This is the wavelength region at which output of sodium light is a maximum.

3. The deposited film should be abrasion-resistant so that it will not wear unduly when repeatedly brought into contact with a photoresist layer.

Several semitransparent masking materials and methods of depositing films of them have been proposed. One of the more technically successful of these has been iron oxide deposited by sputtering. Despite the advantages, such as good durability, of iron oxide films, they have not been widely used because their cost is about 7 to 10 times as great as masks of the photoemulsion type.

The present method provides a more economical way to make iron oxide photomasks.

THE DRAWINGS

FIGS. 1–7 are similar cross-sectional views illustrating successive steps in making a photomask in accordance with the invention; and FIG. 8 is a graph of light transmission of an iron oxide film deposited by the method of the present invention.

DESCRIPTION OF PREFERRED EMBODIMENTS

Figure 1:
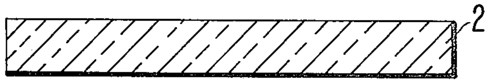
Figure 2:
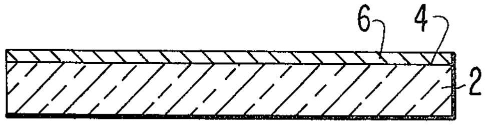

In one example of making a photomask in accordance with the present method, a glass plate 2 is thoroughly cleaned and degreased. One surface 4 of the plate (FIG. 2) is then electrolessly plated with a thin film 6 of a nickel-phosphorus alloy. Alternatively, this can be a nickel-boron alloy or pure nickel. The opposite side of the plate is covered with a masking material (not shown).

The complete plating process includes sensitization and activation steps prior to deposition of the metal. To sensitize the glass surface 4, it is dipped in a solution containing about 10 g/liter of $SnCl_2.2H_2O$ and 15 ml/liter of concentrated (37 percent) HCl. After the sensitization step, the plate is thoroughly rinsed with water.

The sensitized surface is next activated with a solution of palladium chloride. The activating solution consists of 1 g/liter of palladium chloride and 1 ml/liter of concentrated HCl. The remainder of the solution is water. After treatment with the activating solution for a brief period, the plate is again rinsed with water.

The activated surface is now plated with a nickel alloy film 6 by an electroless process. A preferred working bath contains a sufficient amount of a soluble nickel compound, such as nickel sulfamate, to furnish 5.2 g/liter of nickel. The bath also contains about 34 g/liter of sodium formate, and 15 g/liter of $NaH_2PO_2.H_2O$. The bath is maintained at a pH of 5 and a temperature of about 70° C.

The sensitized and activated plate is immersed in this solution for about 1 minute to provide a nickel-phosphorus plating which has a thickness such that it has a light transmission characteristic of about 40 percent in the visible and ultraviolet. This layer may have a thickness of about 500 A – 700 A. With the plating bath operated at 70° C, the plated film will contain about 9 percent by weight phosphorus co-deposited with the nickel.

After the above deposition is completed, the plate is removed from the bath, rinsed and dried.

Time in the plating bath may be used to control film thickness. Film thickness may be such as to impart a light- (ultraviolet and visible) transmitting characteristic of 30 – 40 percent.

The nickel or nickel alloy film may also be deposited by other methods such as evaporation or sputtering.

Figure 3:
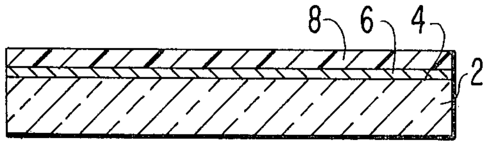
Figure 4:
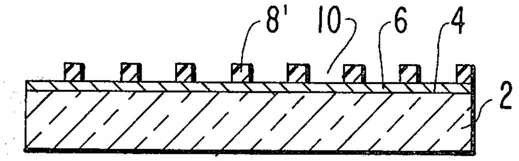

Next, an overall coating of photoresist 8 (FIG. 3) is deposited on the nickel-phosphorus alloy film 6. A pattern of openings 10 (FIG. 4) is then formed in the photoresist layer 8 by conventional exposing and developing steps. This pattern of openings corresponds to the desired pattern of metal areas in the completed photomask. The areas 8' of the photoresist which remain after the developing step, function as a lattice work matrix in the openings of which a pattern of metal is to be deposited.

Figure 5:
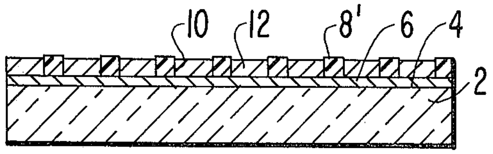

This pattern of metal (FIG. 5) is formed by electrolytically depositing areas of iron 12 within the openings 10 of the photoresist layer 8'.

Following are 2 examples of suitable baths for electrolytically depositing iron.

EXAMPLE 1

| | |
|---|---|
| $FeSO_4.7H_2O$ | 250 g/liter |
| $(NH_4)_2SO_4$ | 120 g/liter |
| pH | 5.5 |
| Temp. | 25°C |
| Current density | 0.1 to 1 Amp/dm² |
| Anode to cathode ratio | Max. 1:1 |

EXAMPLE 2

| | |
|---|---|
| $FeCl_2.4H_2O$ | 300 g/liter |
| $CaCl_2$ | 335 g/liter |
| pH | 1.0 |
| Temp. | 90°c |

-continued

| | |
|---|---|
| Current density | 0.1 to 1 Amp/dm$^2$ |
| Anode to cathode ratio | Max. 1:1 |

The iron layer that is deposited has a thickness of up to about 2000 A, for example, but it preferably has a thickness of about 1500 – 2000 A.

Figure 6:
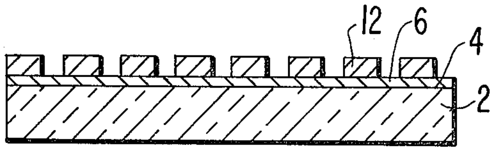
Figure 7:
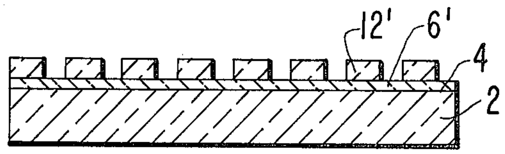

After the pattern of iron areas 12 is deposited, the areas 8' of photoresist are removed by dissolving them. This leaves the iron areas 12 (FIG. 6) in relief. The assembly then is heated in air for 1 hour at about 400° C. This treatment converts the iron areas 12 to areas 12' of predominantly iron oxide ($Fe_2O_3$) (FIG. 7). At the same time, the entire thin film areas 6 of nickel or nickel alloy are also converted to areas of oxides 6' and these areas become highly light transmitting (about 80 percent for the Example) in the visible and hence no etching is required thereafter. The heat treatment also improves the adherence of the film.

In order to obtain good electrical contact during the electroplating, a rim of conducting silver paste (not shown) may be painted on the surface 4 of the plate 2. Iron anodes are used as counter electrodes in the electroplating baths.

Figure 8:
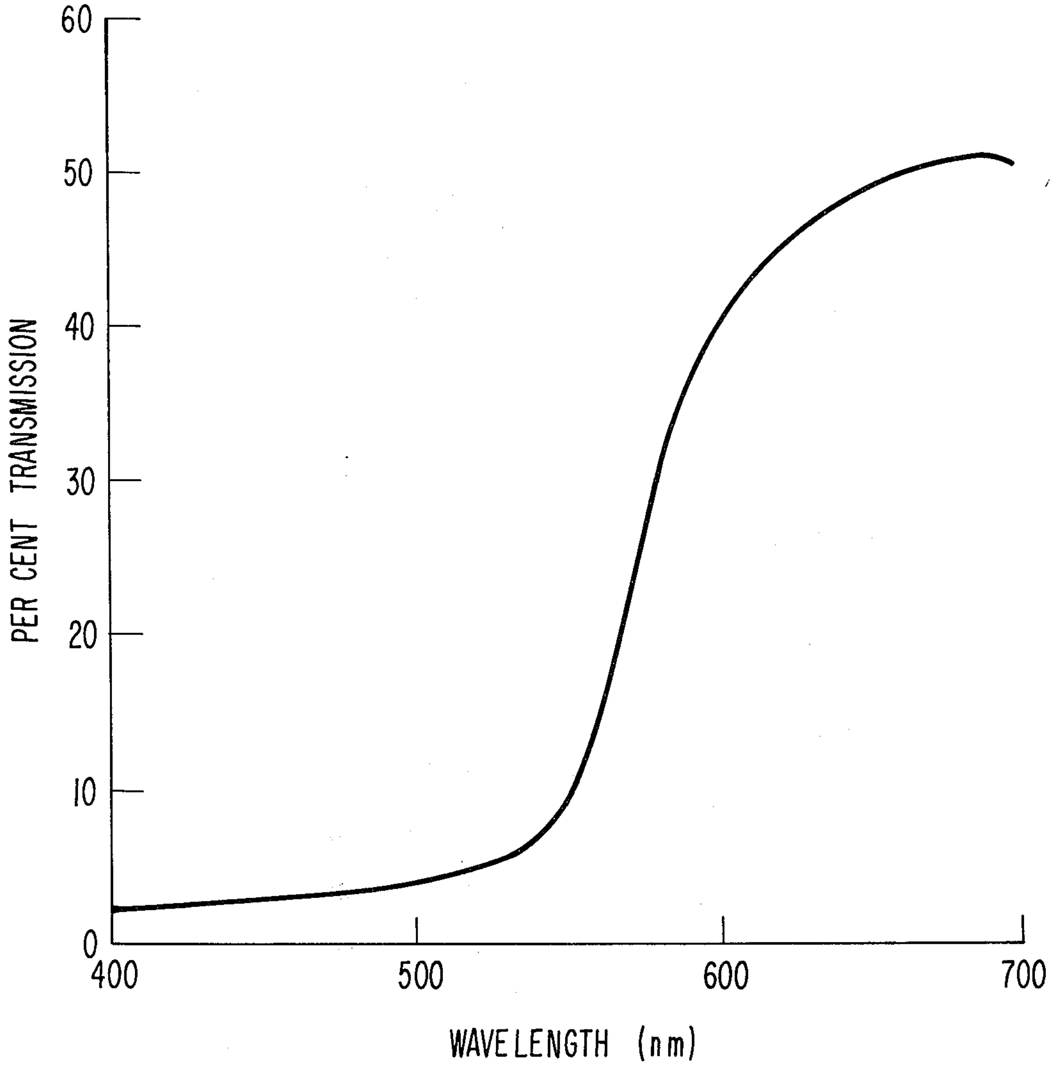

FIG. 8 is a curve of percent light transmission over a range of wavelengths which includes the 589 nm region, of a film of iron oxide prepared by the present method. The curve shows that transmission is adequate for mask registration purposes.

We claim:

1. A semitransparent photomask comprising a glass plate having disposed on a surface thereof a thin, transparent film of nickel oxide or an oxide of either a nickel-phosphorus alloy or a nickel-boron alloy and a pattern of areas of ferric oxide on said film, said ferric oxide having good light-transmission properties in the 589 nm region but not in the ultraviolet region of the spectrum.

2. A photomask according to claim 1 in which said nickel oxide or nickel alloy oxide film has a thickness of about 400 A.

* * * * *